(12) United States Patent
Bruhns et al.

(10) Patent No.: US 6,995,032 B2
(45) Date of Patent: Feb. 7, 2006

(54) TRENCH CUT LIGHT EMITTING DIODES AND METHODS OF FABRICATING SAME

(75) Inventors: Michael T. Bruhns, Pittsboro, NC (US); Brad Williams, Cary, NC (US); Jeff LaHaye, Cary, NC (US); Peter Andrews, Durham, NC (US)

(73) Assignee: Cree, Inc., Durham, NC (US)

( * ) Notice: Subject to any disclaimer, the term of this patent is extended or adjusted under 35 U.S.C. 154(b) by 44 days.

(21) Appl. No.: 10/610,329

(22) Filed: Jun. 30, 2003

(65) Prior Publication Data

US 2004/0051118 A1    Mar. 18, 2004

Related U.S. Application Data

(60) Provisional application No. 60/397,488, filed on Jul. 19, 2002, provisional application No. 60/415,898, filed on Oct. 3, 2002.

(51) Int. Cl.
  *H01L 21/00* (2006.01)
(52) U.S. Cl. ......................................... 438/33; 438/637
(58) Field of Classification Search ................. 438/39, 438/33, 38, 42
  See application file for complete search history.

(56) References Cited

U.S. PATENT DOCUMENTS

| | | | |
|---|---|---|---|
| 4,966,862 A | 10/1990 | Edmond | |
| 5,418,190 A * | 5/1995 | Cholewa et al. | 438/33 |
| 5,429,954 A * | 7/1995 | Gerner | 438/33 |
| 5,631,190 A | 5/1997 | Negley | 438/33 |
| 5,912,477 A | 6/1999 | Negley | 257/95 |
| 5,916,460 A | 6/1999 | Imoto et al. | 219/121.67 |
| 5,923,053 A | 7/1999 | Jakowetz et al. | |
| 5,923,946 A | 7/1999 | Negley | 438/4 |
| 5,972,781 A * | 10/1999 | Wegleiter et al. | 438/460 |
| 6,048,748 A * | 4/2000 | Khare et al. | 438/39 |
| 6,413,839 B1 | 7/2002 | Brown et al. | 438/463 |
| 6,518,079 B2 * | 2/2003 | Imler | 438/33 |
| 6,580,054 B1 | 6/2003 | Liu et al. | |
| 2005/0017258 A1 * | 1/2005 | Fehrer et al. | 257/98 |

FOREIGN PATENT DOCUMENTS

| | | |
|---|---|---|
| JP | 09270528 | 10/1997 |
| JP | 09270528 A | 1/1998 |
| WO | WO 02/37578 A1 | 5/2002 |
| WO | WO 03/030271 A2 | 4/2003 |
| WO | WO 2003/030271 A3 | 4/2003 |
| WO | WO 03/010817 A2 | 6/2003 |
| WO | WO 03/010817 A3 | 6/2003 |

OTHER PUBLICATIONS

International Search Report for PCT/US03/22411, Jun. 7, 2004.

* cited by examiner

*Primary Examiner*—Thao P. Le
(74) *Attorney, Agent, or Firm*—Myers Bigel Sibley & Sajovec, P.A.

(57) ABSTRACT

A method is provided for forming semiconductor devices using a semiconductor substrate having first and second opposed sides, and at least one device layer on the second side of the substrate, the at least one device layer including first and second device portions. A first trench is formed in the first side of the substrate between the first and second device portions. A second trench is formed in the second side of the substrate between the first and second device portions.

76 Claims, 5 Drawing Sheets

US 6,995,032 B2

TRENCH CUT LIGHT EMITTING DIODES AND METHODS OF FABRICATING SAME

RELATED APPLICATIONS

The present application claims the benefit of and priority from U.S. Provisional Patent Application No. 60/397,488, filed Jul. 19, 2002, and from U.S. Provisional Patent Application No. 60/415,898, filed Oct. 3, 2002, the disclosures of which are hereby incorporated herein by reference in their entireties.

FIELD OF THE INVENTION

This invention relates to microelectronic devices and fabrication methods therefor, and more particularly to structures which may be utilized in semiconductor devices, such as light emitting diodes (LEDs).

BACKGROUND OF THE INVENTION

Light emitting diodes are widely used in consumer and commercial applications. As is well known to those having skill in the art, a light emitting diode generally includes a diode region on a microelectronic substrate. The microelectronic substrate may comprise, for example, gallium arsenide, gallium phosphide, alloys thereof, silicon carbide and/or sapphire. Continued developments in LEDs have resulted in highly efficient and mechanically robust light sources that can cover the visible spectrum and beyond. These attributes, coupled with the potentially long service life of solid state devices, may enable a variety of new display applications, and may place LEDs in a position to compete with the well entrenched incandescent lamp.

GaN-based light emitting diodes (LEDs) typically comprise an insulating, semiconducting or conducting substrate such as sapphire or SiC on which a plurality of GaN-based epitaxial layers are deposited. The epitaxial layers comprise an active region having a p-n junction that emits light when energized. A typical LED is mounted substrate side down onto a submount, also called a package or lead frame (hereinafter referred to as a "submount"). FIG. 1 schematically illustrates a conventional LED having an n-type SiC substrate 10, an active region 12 comprising an n-GaN-based layer 14 and a p-GaN-based layer 16 grown on the substrate and patterned into a mesa. A metal p-electrode 18 is deposited on and electrically coupled to the p-GaN layer 16 and a wire bond connection 28 is made to a bond pad 20 on the p-electrode 18. An n-electrode 22 that is on and electrically coupled to the conductive substrate is attached to metallic submount 24 using a conductive epoxy 26. In the conventional process, the conductive epoxy 26 (usually silver epoxy) is deposited on the submount and the LED is pressed into the epoxy 26. The epoxy is then heat cured which causes it to harden, providing a stable and electrically conductive mount for the LED chip. Light generated in the active region 12 is directed up and out of the device. However, a substantial amount of the generated light may be transmitted into the substrate and partially absorbed by the epoxy 26.

Flip-chip mounting of LEDs involves mounting the LED onto the submount substrate side up. Light is then extracted and emitted through the transparent substrate. Flip chip mounting may be an especially desirable technique for mounting SiC-based LEDs. Because SiC has a higher index of refraction than GaN, light generated in the active region does not internally reflect (i.e. reflect back into the GaN-based layers) at the GaN/SiC interface. Flip chip mounting of SiC-based LEDs may offer improved light extraction when employing certain chip-shaping techniques known in the art. Flip chip packaging of SiC LEDs may have other benefits as well, such as improved heat extraction/dissipation, which may be desirable depending on the particular application for the chip.

One problem with flip-chip mounting is illustrated in FIG. 2. Namely, when a chip is flip-chip mounted on a conductive submount or package conventional techniques may not be possible. Conventionally, a conductive die attach material 26, such as silver epoxy, is deposited on the chip and/or on the submount 24, and the chip is pressed onto the submount 24. This can cause the viscous conductive die attach material 26 to squeeze out and make contact with the n-type layers 14 and 10 in the device, thereby forming a Schottky diode connection that shunts the p-n junction in the active region with predictably undesirable results.

A further problem may arise from the stress applied to the side of the die during breaking when LED dies are singulated from a wafer by a sawing and breaking. This stress can cause fractures in the edge of the chip. If the fractures are bad enough, the die may be ruined. For example, if the fractures extend into the active regions of the device the device may be ruined.

SUMMARY OF THE INVENTION

Embodiments of the present invention provide light emitting devices and methods of fabricating light emitting diodes that have a trench that extends into a substrate of the device from an epi-side of the substrate. The trench is located at the periphery of a mesa that defines individual devices and is located at a region where a wafer is broken to provide singulation of the light emitting devices. In some embodiments of the present invention, a passivation layer is provided on exposed portions of the trench. In embodiments of the present invention having active regions that are defined by a mesa isolation trench, a second trench is provided within the mesa isolation trench, the second trench extends into the substrate of the device and may be located proximate a region of the substrate where the substrate is broken to separate a die from a wafer.

According to method embodiments of the present invention, a method is provided for forming semiconductor devices using a semiconductor substrate having first and second opposed sides, and at least one device layer on the second side of the substrate, the at least one device layer including first and second device portions. A first trench is formed in the first side of the substrate between the first and second device portions. A second trench is formed in the second side of the substrate between the first and second device portions.

According to further method embodiments of the present invention, a method is provided for forming semiconductor devices using a semiconductor substrate having a device side and at least one device layer on the device side of the substrate, the at least one device layer including first and second device portions. An isolation trench is formed in the at least one device layer and defines a first mesa including the first device portion and a second mesa including the second device portion. A second trench is formed in the device side of the substrate in and along the isolation trench. The second trench extends between the first and second device portions.

According to embodiments of the present invention, a semiconductor substrate assembly includes a semiconductor substrate having first and second opposed sides and at least one device layer on the second side of the substrate. The at least one device layer includes first and second device portions. A first trench is defined in the first side of the substrate between the first and second device portions. A second trench is defined in the second side of the substrate between the first and second device portions.

According to embodiments of the present invention, a semiconductor substrate assembly includes a semiconductor substrate having a device side and at least one device layer on the device side of the substrate. The at least one device layer includes first and second device portions. An isolation trench is defined in the at least one device layer. The isolation trench defines a first mesa including the first device portion and a second mesa including the second device portion. A second trench is defined in the device side of the substrate in and along the isolation trench. The second trench is defined extends between the first and second device portions.

Objects of the present invention will be appreciated by those of ordinary skill in the art from a reading of the figures and the detailed description of the preferred embodiments which follow, such description being merely illustrative of the present invention.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF PREFERRED EMBODIMENTS

Figure 1:
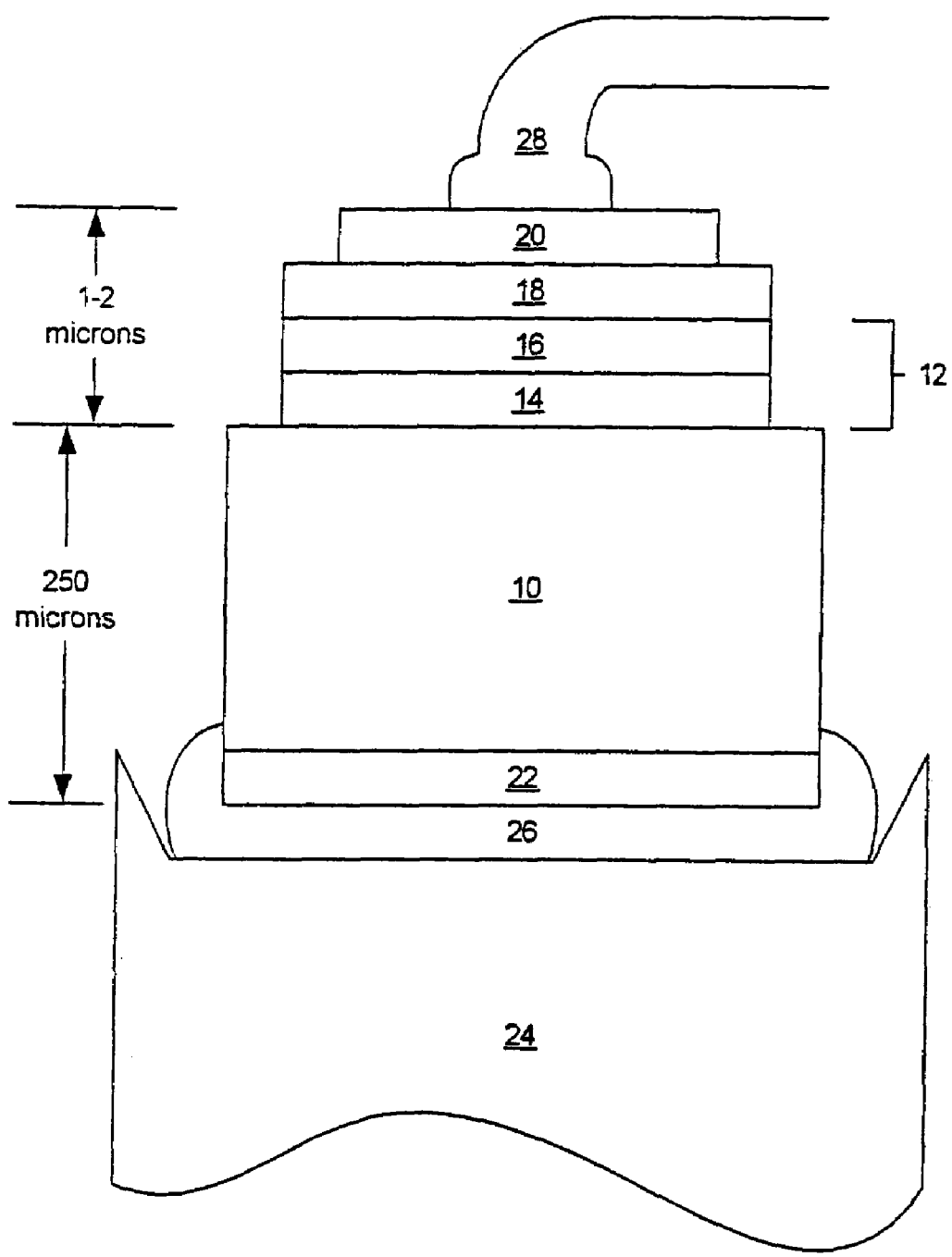
FIG. 1 is a schematic illustration of a conventional LED.
Figure 2:
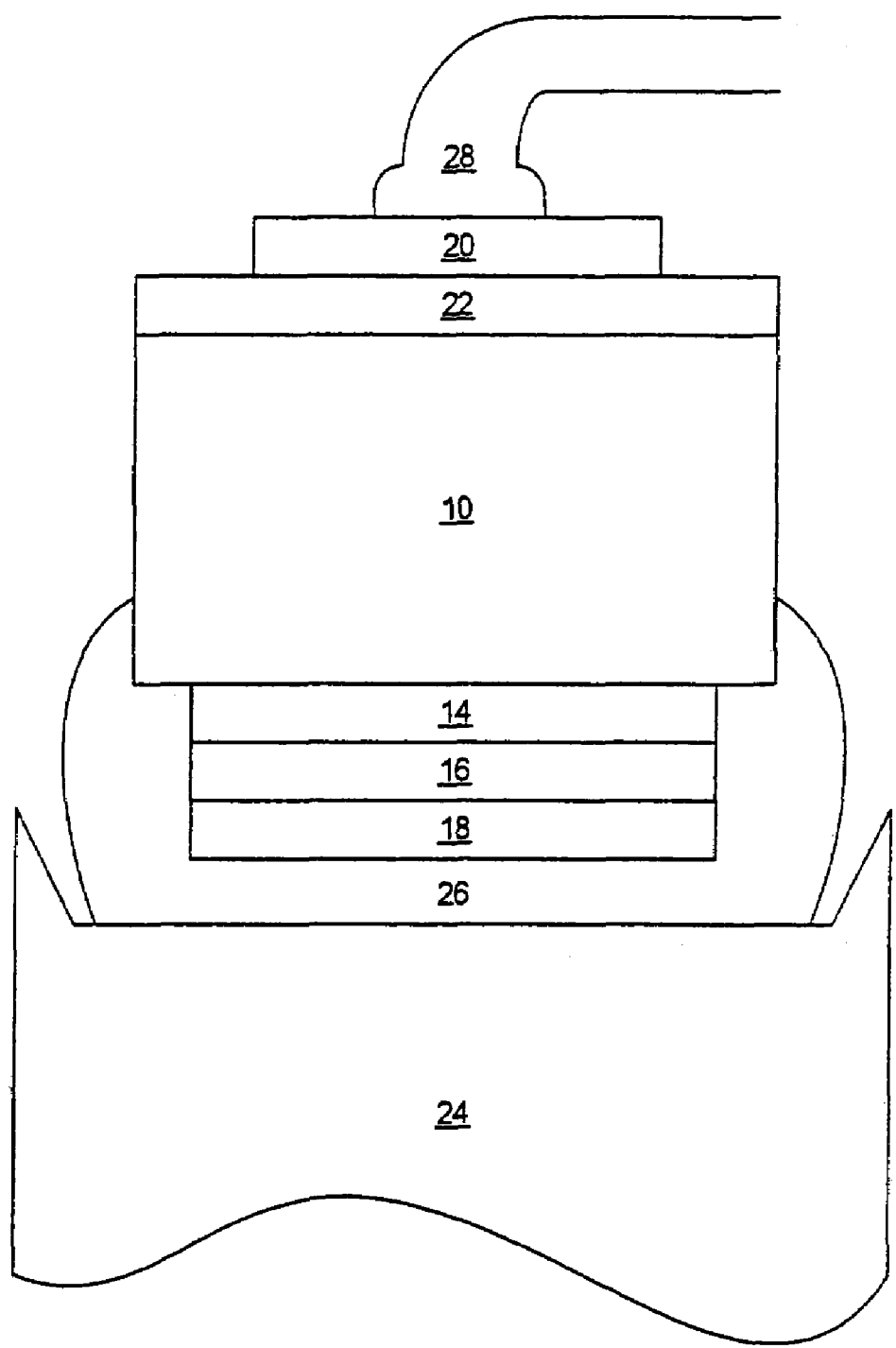
FIG. 2 is a schematic illustration of a flip-chip mounted LED utilizing conventional techniques.

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. Furthermore, the various layers and regions illustrated in the figures are illustrated schematically. As will also be appreciated by those of skill in the art, references herein to a layer formed "on" a substrate or other layer may refer to the layer formed directly on the substrate or other layer or on an intervening layer or layers formed on the substrate or other layer. Accordingly, the present invention is not limited to the relative size and spacing illustrated in the accompanying figures.

Embodiments of the present invention provide a light emitting device such as, for example, a light emitting device having a shaped substrate and/or that is suitable for flip-chip mounting. The light emitting device has a trench that extends into the substrate of the device from the surface on which the active regions of the device (e.g. an "epi" side of the device) are formed and opposite a shaped substrate side of the device. The epi-side trench may provide a stress relief or step to facilitate breaking of the wafer which may reduce yield loss due to propagation of breaks that extend into the junction of the device. Additionally, for flip-chip mounted devices, the epi-side trench may enable the insulating passivation material to be deposited onto the post-trench cut wafer, effectively wrapping the passivation material around the trench cut. Thus, an insulating barrier may be provided against die attach materials (e.g. solder) making contact with the SiC substrate, thus creating a short or shunt between the p and n junctions of the device during die attach.

As mentioned above, in certain embodiments of the present invention, the light emitting device may have a shaped substrate. Because of the high index of refraction of SiC, light passing through a SiC substrate tends to be totally internally reflected into the substrate at the surface of the substrate unless the light strikes the interface at a fairly low angle of incidence (i.e. fairly close to normal). The critical angle for total internal reflection depends on the material with which forms the interface with the SiC substrate. It is possible to increase the light output from a SiC-based LED by shaping the SiC substrate in a manner that limits total internal reflection by causing more rays to strike the surface of the SiC at low angles of incidence. One such chip shaping technique and resulting chip is shown in U.S. patent application Ser. No. 10/057,821, filed Jan. 25, 2002, entitled "LIGHT EMITTING DIODES INCLUDING SUBSTRATE MODIFICATIONS FOR LIGHT EXTRACTION AND MANUFACTURING METHODS THEREFOR," which is hereby incorporated by reference.

Figure 3:
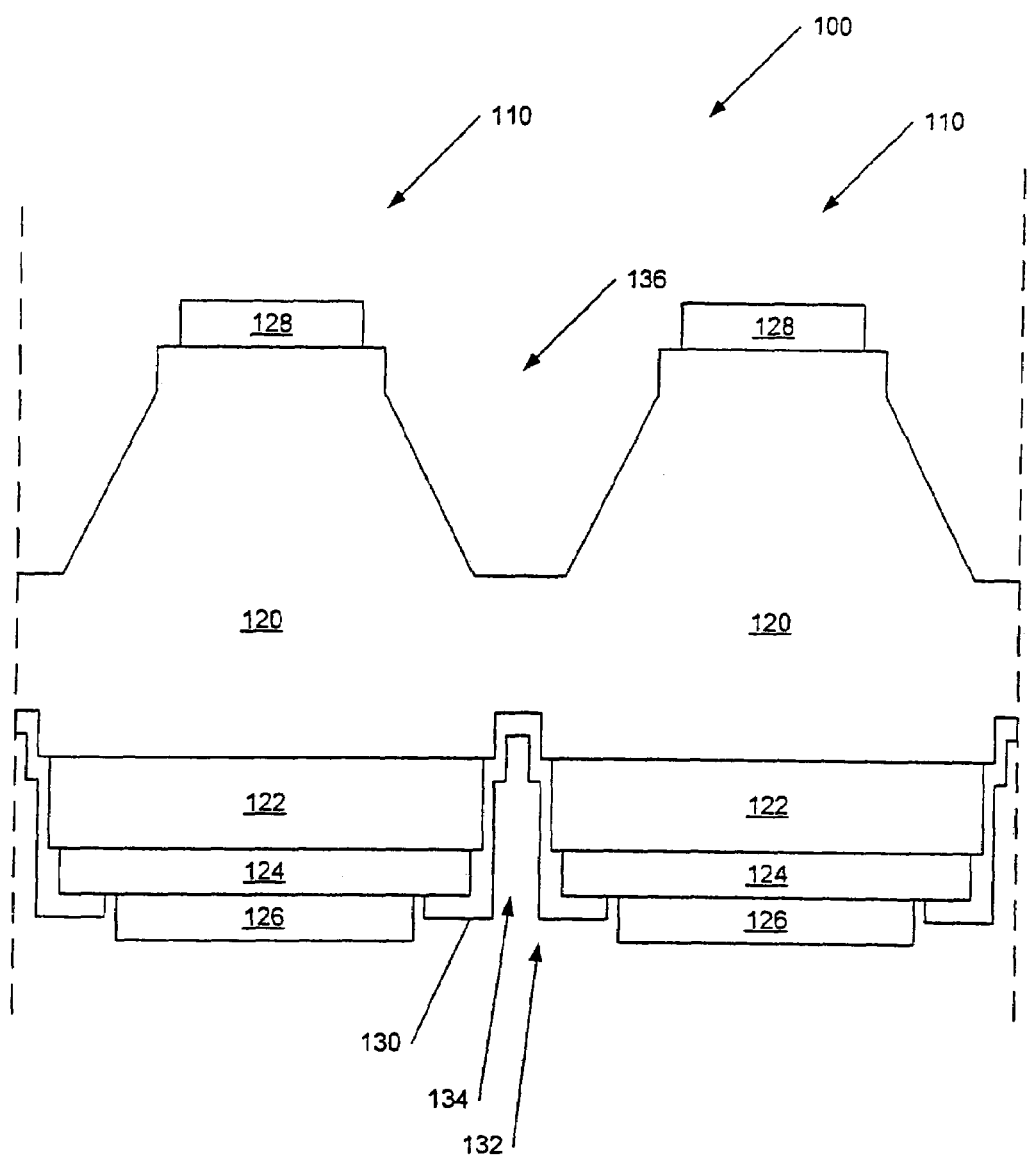
FIG. 3 is a schematic illustration of a portion of a wafer of LEDs according to embodiments of the present invention.

FIG. 3 illustrates LED chips having shaped substrates such as those described in the above referenced patent application prior to singulation. Specifically, a wafer 100 includes LED chips 110 as shown in FIG. 3 that include a substrate 120, such as a SiC substrate. An active device region 122 of the LED chips 110 may include Group III nitrides, such as GaN based layers. Contacts 124 and 128 are provided on the active device regions 122 and the substrate 120. Additionally, eutectic metal regions 126 may also be provided.

The active regions 122 are formed into mesas by an isolation trench 132. The isolation trench 132 serves to define individual or groups of devices and is substantially aligned with the shaping trench (or cut) or "streets" 136 of the substrate 120 utilized to separate the devices and, in some embodiments, to provide the desired shape of the substrate. As is further illustrated in FIG. 3, a second trench 134 is also formed in the substrate 120. The second trench 134 is also substantially aligned with the streets 136 of the substrate 120 and, in some embodiments, is formed within the isolation trench 132 that forms the mesa termination of the active regions 122.

The second trench 134 may be provided in a separate fabrication step or may be formed in a single step with the formation of the isolation trench 132. For example, the second trench 134 may be diced, sawn, etched, water sawn, laser scribed or created using other methods of standard hard material semiconductor separation or singulation techniques.

In some embodiments of the present invention, the second trench 134 extends into the substrate 120 a distance sufficient to provide stress relief and/or facilitate the breaking of the substrate in the singulation process so as to reduce the propagation of the breaks into the active regions 122. For example, in some embodiments of the present invention, the second trench 134 extends at least about 2 µm into the substrate 120. In other embodiments, the second trench 134 extends at least about 5 µm into the substrate 120. In other embodiments of the present invention, the second trench 134 extends at least about 10 µm into the substrate 120. In a particular embodiment of the present invention, the second trench 134 extends at least about 20 µm into the substrate 120. According to some preferred embodiments, the second trench 134 extends into the substrate 120 a depth of between about 2 and 5 µm. According to some embodiments, the depth of the second trench 134 into the substrate 120 is at least 1% of the thickness of the substrate 120. According to some preferred embodiments, a depth of the second trench 134 into the substrate 120 is between about 5 and 20% of the substrate 120.

Furthermore, the second trench 134 may also have a width sufficient to provide stress relief and/or facilitate the breaking of the substrate in the singulation process so as to reduce the propagation of the breaks into the active regions 122. In various embodiments of the present invention, light emitting device structures may be provided as the active regions 122. For example, in some embodiments of the present invention, the second trench 134 has a width of at least about 2 µm. In other embodiments, the second trench 134 has a width of at least about 5 µm. In other embodiments of the present invention, the second trench 134 has a width of at least about 10 µm. In a particular embodiment of the present invention, the second trench 134 has a width of at least about 25 µm. According to some embodiments, the second trench 134 has a width of between about 2 and 25 µm.

According to some embodiments, the isolation trench 132 has a depth of at least about 1 µm. According to some preferred embodiments, the isolation trench 132 has a depth of between about 2 and 4 µm.

According to some embodiments, the isolation trench 132 has a width of at least 30 µm. According to some preferred embodiments, the isolation trench 132 has a width of between about 50 and 70 µm.

According to some embodiments, the shaping trench 136 has a depth into the substrate 120 of at least 100 µm. According to some preferred embodiments, the shaping trench 136 has a depth into the substrate of between about 200 and 220 µm.

According to some embodiments, the shaping trench 136 has a width of at least 50 µm. According to some preferred embodiments, the shaping trench 136 has a width of between about 75 and 125 µm.

According to some preferred embodiments, the second trench 134 has a depth into the substrate 120 of between about 2 and 5 µm with the shaping trench 136 having a depth into the substrate 120 of between about 150 and 200 µm. According to some embodiments, the depth of the second trench 134 into the substrate 120 is between about 5 and 10% of the depth of the shaping trench 136 into the substrate. According to some embodiments, the thickness of the substrate 120 remaining between the second trench 134 and the shaping trench 136 is at least 5% of the original thickness of the substrate 120. According to some embodiments, the thickness of the substrate 120 remaining between the second trench 134 and the shaping trench 136 is between about 5 and 15% of the original thickness of the substrate 120.

As is further illustrated in FIG. 3, a passivation layer 130, such as an oxide, nitride and/or oxynitride, may be provided on the surfaces exposed by the isolation trench 132 and the second trench 134. Thus, the passivation layer 130 may extend into the substrate 120 a distance corresponding to the depth of the second trench 134. In particular embodiments of the present invention, The passivation material can be Silicon Nitride (SiN), doped or undoped Silicon Dioxide (SiO$_2$), Silicon Oxy-Nitride (SiO$_x$N$_y$), Spin-on Glass, Polyimide, or any other insulating material or combination of films, and may be deposited by CVD, LPCVD, PECVD, sputtering, or spin-on dispense of uncured liquid followed by a curing process.

Formation of the passivation layer 130 into the substrate may provide protection against LED assembly shorts or shunts due to die attach material wicking around a p-n junction in the active regions 122. Thus, in embodiments of the present invention having the passivation layer 130 formed after formation of the second trench 134, the depth of the second trench 134 may also be selected so as to reduce the likelihood of the formation of a parasitic Schottky diode when the device 110 is mounted.

In certain embodiments of the present invention, the active regions 122 may be gallium nitride based LEDs or lasers fabricated on a silicon carbide substrate such as those devices manufactured and sold by Cree, Inc. of Durham, N.C. For example, the present invention may be suitable for use with LEDs and/or lasers as described in U.S. Pat. Nos. 6,201,262, 6,187,606, 6,120,600, 5,912,477, 5,739,554, 5,631,190, 5,604,135, 5,523,589, 5,416,342, 5,393,993, 5,338,944, 5,210,051, 5,027,168, 5,027,168, 4,966,862 and/or 4,918,497, the disclosures of which are incorporated herein by reference as if set forth fully herein. Other suitable LEDs and/or lasers are described in U.S. Provisional Patent Application Serial No. 60/294,378, entitled "LIGHT EMITTING DIDODE STRUCTURE WITH MULTI-QUANTUM WELL AND SUPERLATTICE STRUCTURE", U.S. Provisional Patent Application Ser. No. 60/294,445, entitled "MULTI-QUANTUM LIGHT EMITTING DIODE STRUCTURE" and U.S. Provisional Patent Application Ser. No. 60/294,308, entitled "LIGHT EMITTING DIDODE STRUCTURE WITH SUPERLATTICE STRUCTURE", each filed May 30, 2001, U.S. patent application Ser. No. 10/140,796, entitled "GROUP III NITRIDE BASED LIGHT EMITTING DIODE STRUCTURES WITH A QUANTUM WELL AND SUPERLATTICE, GROUP III NITRIDE BASED QUANTUM WELL STRUCTURES AND GROUP III NITRIDE BASED SUPERLATTICE STRUCTURES", filed May 7, 2002, as well as U.S. Provisional Patent Application Ser. No. 10/057,82, entitled "LIGHT EMITTING DIODES INCLUDING SUBSTRATE MODIFICATIONS FOR LIGHT EXTRACTION AND MANUFACTURING METHODS THEREFOR", filed Jul. 23, 2001 and U.S. patent application Ser. No. 10/057,82, filed Jan. 25, 2002, entitled "LIGHT EMITTING DIODES INCLUDING SUBSTRATE MODIFICATIONS FOR LIGHT EXTRACTION AND MANUFACTURING METHODS THEREFOR", the disclosures of which are incorporated herein as if set forth fully.

In particular embodiments of the present invention, the light emitting devices may include a p-electrode that provides a reflecting layer to reflect light generated in the active region back through the device. Reflective p-electrodes and related structures are described in U.S. patent application Ser. No. 10/057,82, entitled "LIGHT EMITTING DIODES INCLUDING SUBSTRATE MODIFICATIONS FOR LIGHT EXTRACTION AND MANUFACTURING METHODS THEREFOR", filed Jan. 25, 2002, which is hereby incorporated by reference as if set forth fully herein.

The LEDs and/or lasers may be configured to operate in a "flip-chip" configuration such that light emission occurs through the substrate. In such embodiments, the substrate may be patterned so as to enhance light output of the devices as is described, for example, in U.S. Provisional Patent Application Ser. No. 60/307,235, filed Jul. 23, 2001, entitled "LIGHT EMITTING DIODES INCLUDING SUBSTRATE MODIFICATIONS FOR LIGHT EXTRACTION AND MANUFACTURING METHODS THEREFOR" and U.S. patent application Ser. No. 10/057,82, filed Jan. 25, 2002, entitled "LIGHT EMITTING DIODES INCLUDING SUBSTRATE MODIFICATIONS FOR LIGHT EXTRACTION AND MANUFACTURING METHODS THEREFOR."

Figure 4:
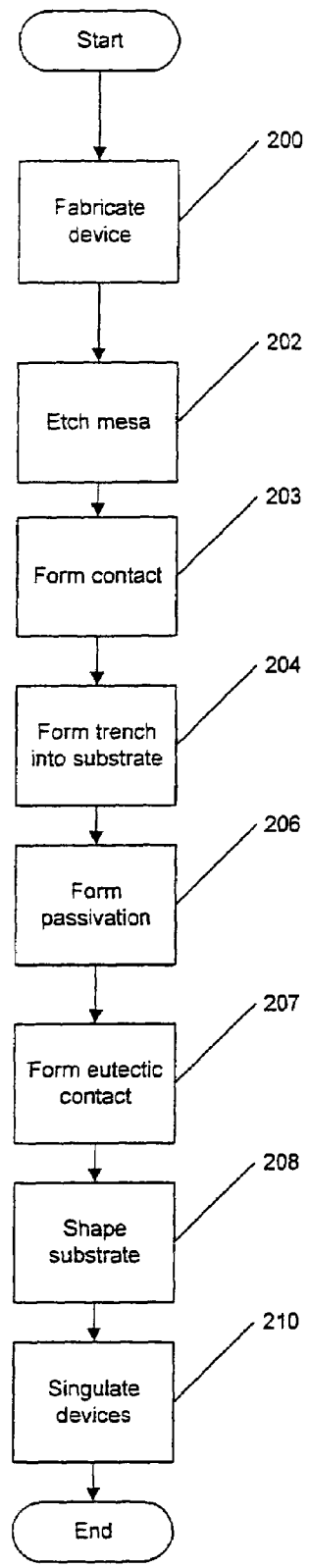
FIG. 4 is a flowchart illustrating processing steps in the fabrication of LEDs according to embodiments of the present invention.

FIG. 4 illustrates methods of fabricating light emitting devices according to embodiments of the present invention. As seen in FIG. 4, a light emitting device such as those described above is fabricated (block 200). The layers of the light emitting device are etched (e.g., such that an isolation trench (e.g., the isolation trench 132) is formed) to form a mesa (block 202). The contact on the active layers is then formed on the resulting mesa (block 203). A trench (e.g., the second trench 134) is formed that extends into the substrate in regions where the wafer is to be broken as described above and may be formed at the periphery of the mesa (block 204). A passivation layer is formed on the exposed surfaces of the mesa and the trench (block 206). An opening is formed in the passivation layer and the eutectic metal contact formed (block 207). Optionally, the substrate of the device opposite the active regions of the device is shaped (e.g., by forming a shaping trench such as the shaping trench 136) (block 208). The devices are then singulated (either to form individual dies or groups of dies) by breaking the wafer along lines which divide the dies (block 210).

Figure 5:
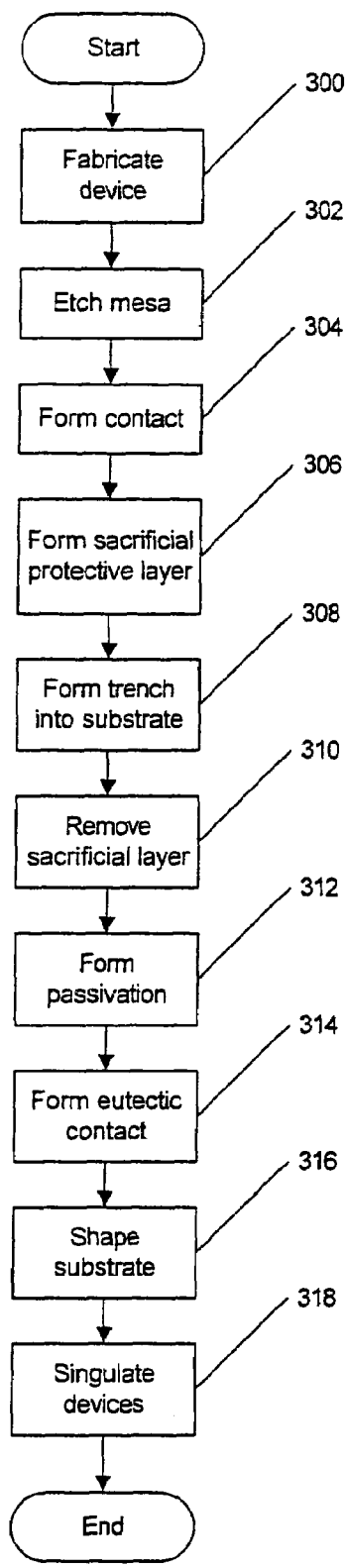
FIG. 5 is a flowchart illustrating processing steps in the fabrication of LEDs according to further embodiments of the present invention.

FIG. 5 illustrates methods of fabricating light emitting devices according to embodiments of the present invention where a protective layer is provided during fabrication of the epi-side trench. As seen in FIG. 5, a light emitting device such as those described above is fabricated (block 300). The layers of the light emitting device are etched (e.g., such that an isolation trench (e.g., the isolation trench 132) is formed) to form a mesa (block 302). The contact on the active layers is then formed on the resulting mesa (block 304). A sacrificial protective layer is formed on the resulting mesa, including the sidewalls of the mesa (block 306). The protective layer may be provided to protect the active region from contamination or physical damage during the formation of the epi-side trench. In particular embodiments, the protective layer may, for example, be a dielectric layer such as silicon nitride, silicon oxynitride, silicon dioxide or the like, or may be photoresist material. However, any material that may protect the mesa during formation of the trench may be utilized.

A trench (e.g., the second trench 134) is formed that extends into the substrate in regions where the wafer is to be broken as described above and may be formed at the periphery of the mesa (block 308). In particular embodiments, the trench is formed by sawing or laser scribing, for example, through the sacrificial protective layer while at least a portion of the sacrificial protective layer remains on the sidewall of the mesa so as to protect the mesa from contaminants or physical damage resulting from the saw cut. After the trench formation is completed, the sacrificial protective layer is removed from the mesa (block 310). The particular technique for removal of the sacrificial protective layer will depend on the nature of the sacrificial protective layer. Methods for removing dielectric and photoresist layers are well known to those skilled in the art.

A passivation layer is formed on the exposed surfaces of the mesa and the trench (block 312). An opening is formed in the passivation layer and the eutectic metal contact formed (block 314). Optionally, the substrate of the device opposite the active regions of the device is shaped (e.g., by forming a shaping trench such as the shaping trench 136) (block 316). The devices are then singulated (either to form individual dies or groups of dies) by breaking the wafer along lines which divide the dies (block 318).

In particular embodiments of the present invention, the shaping of the substrate may be provided by a sawing or scoring operation where the sawing or scoring of the substrate defines the shaped portion of the substrate. For example, a saw blade used to cut lines in a wafer may define an ATON shape (e.g. a truncated pyramid with a cubic portion on top). Such saw cuts may then be used as break lines to singulate the devices.

As discussed above, the second trench 134 may be formed by laser scribing. More particularly, a laser may be employed to remove portions of the substrate 120 and, as needed, any overlying layers (e.g., the layers from which the active device regions 122 are formed) by ablation. Any suitable laser may be used. According to some embodiments, a Nd-YAG, excimer or other short wavelength laser is used.

Furthermore, while operations for fabrication of devices are illustrated with reference to particular sequences in FIGS. 4 and/or 5, embodiments of the present invention should not be construed as limited to such sequences. For example, the trench (e.g., the trench 134) may be formed before forming the mesa or after formation of the passivation layer. Formation of the trench after formation of the passivation layer may be suitable for devices which are not to be flip-chip mounted. Thus, the present invention should not be construed as limited to the particular sequences of operations illustrated in FIGS. 4 and/or 5.

While the present invention has been described with reference to a device isolation trench and a second trench, as will be appreciated by those of skill in the art in light of the present disclosure, a single trench may provide both the isolation trench and the second trench. Furthermore, more than two trenches may also be provided. Thus, embodiments of the present invention should not be construed as limited to a particular number of discrete trenches.

While embodiments of the present invention have been described with reference to gallium nitride based devices, the teachings and benefits of the present invention may also be provided in other Group III nitrides or other semiconductor materials. Furthermore, while embodiments of the present invention have been described with reference to a shaped substrate having a cubic portion and a truncated pyramidal portion as illustrated in FIG. 3, other shapes of substrates may be utilized. Thus, embodiments of the present invention should not be construed as limited to the particular shapes described herein.

While described with reference to LEDs and/or lasers, the methods and assemblies of the present invention may also be used for other devices that are singulated, such as diodes, transistors, thyristors or the like.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of That which is claimed is:

1. A method for forming semiconductor devices using a semiconductor substrate having first and second opposed sides, and at least one device layer on the second side of the substrate, the at least one device layer including first and second device portions, the method comprising the steps of:
   a) forming a first trench in the first side of the substrate between the first and second device portions; and
   b) forming a second trench in the second side of the substrate between the first and second device portions.

2. The method of claim 1 further comprising breaking the substrate along the first and second trenches to form first and second dies, the first die including a first portion of the substrate and the first device portion, and the second die including a second portion of the substrate and the second device portion.

3. The method of claim 2 wherein the first and second dies include first and second light emitting diodes (LEDs), respectively.

4. The method of claim 2 wherein the first and second dies include first and second laser diodes, respectively.

5. The method of claim 1 wherein the step of forming the second trench includes forming the second trench such that the second trench is substantially parallel to the first trench.

6. The method of claim 5 wherein the step of forming the second trench includes forming the second trench such that the second trench is substantially aligned with the first trench.

7. The method of claim 1 further comprising forming a third trench in the at least one device layer, the third trench defining a first mesa including the first device portion and a second mesa including the second device portion.

8. The method of claim 7 wherein the step of forming the second trench includes forming the second trench in the third trench.

9. The method of claim 8 further comprising forming an electrically insulating passivation layer on exposed surfaces of the first and second mesas and the substrate along the second trench.

10. The method of claim 9 wherein the passivation layer is formed of an oxide, a nitride, an oxynitride, a spin-on glass, and/or a polyimide.

11. The method of claim 9 wherein the passivation layer is formed using a deposition process.

12. The method of claim 7 wherein the step of forming the third trench includes etching the at least one device layer.

13. The method of claim 1 further comprising forming first and second contacts on the first and second device portions, respectively.

14. The method of claim 13 further comprising forming first and second eutectic metal contacts on each of the first and second contacts, respectively.

15. The method of claim 13 further comprising forming third and fourth contacts on the first side of the substrate opposite the first and second contacts, respectively.

16. The method of claim 1 further comprising forming a sacrificial layer prior to the step of forming the second trench, and removing the sacrificial layer following the step of forming the second trench.

17. The method of claim 1 wherein the step of forming the second trench includes at least one of dicing, sawing, etching, and/or laser scribing.

18. The method of claim 17 wherein the step of forming the second trench includes laser scribing the second trench into the second side of the substrate.

19. The method of claim 17 wherein the step of forming the second trench includes sawing the second trench into the second side of the substrate.

20. The method of claim 1 wherein the step of forming the first trench includes sawing the first trench into the first side of the substrate.

21. The method of claim 20 wherein the step of sawing the first trench includes forming the first trench such that the first trench is ATON-shaped.

22. The method of claim 1 wherein the second trench has a depth within the substrate of at least about 2 $\mu$m.

23. The method of claim 1 wherein the second trench has a depth in the substrate of at least about 1% of the thickness of the substrate.

24. The method of claim 1 wherein the first trench has a depth in the substrate of at least about 100 $\mu$m.

25. The method of claim 24 wherein the first trench has a depth in the substrate of between about 200 and 220 $\mu$m.

26. The method of claim 1 wherein the second trench has a depth in the substrate of between about 2 and 5 $\mu$m, and the first trench has a depth in the substrate of between about 150 and 200 $\mu$m.

27. The method of claim 1 wherein the second trench has a width in the substrate of at least about 2 $\mu$m.

28. The method of claim 27 wherein the second trench has a width in the substrate of between about 2 and 25 $\mu$m.

29. The method of claim 1 wherein the depth of the second trench within the substrate is between about 5 and 10% of the depth of the first trench within the substrate.

30. The method of claim 1 wherein the substrate is formed of a material selected from the group consisting of SiC, GaAs, GaP, sapphire and combinations thereof.

31. The method of claim 30 wherein the substrate is formed of SiC.

32. The method of claim 1 wherein the at least one device layer includes a Group III nitride.

33. A method for forming semiconductor devices using a semiconductor substrate having a device side and at least one device layer on the device side of the substrate, the at least one device layer including first and second device portions, the method comprising the steps of:
   a) forming an isolation trench in the at least one device layer, the isolation trench defining a first mesa including the first device portion and a second mesa including the second device portion;
   b) forming a second trench in the device side of the substrate in and along the isolation trench, the second trench extending between the first and second device portions; and
   c) forming a shaping trench in a side of the substrate opposite the device side.

34. The method of claim 33 further including breaking the substrate along the second trench to form first and second dies, the first die including a first portion of the substrate and the first device portion, and the second die including a second portion of the substrate and the second device portion.

35. The method of claim 34 wherein the first and second dies include first and second light emitting diodes (LEDs), respectively.

36. The method of claim 34 wherein the first and second dies include first and second laser diodes, respectively.

37. The method of claim 33 further comprising forming an electrically insulating passivation layer on exposed surfaces of the first and second mesas and the substrate along the second trench.

38. The method of claim 37 wherein the passivation layer is formed of an oxide, a nitride, an oxynitride, a spin-on glass, and/or a polyimide.

39. The method of claim 37 wherein the passivation layer is formed using a deposition process.

40. The method of claim 33 wherein the step of forming the isolation trench includes etching the at least one device layer.

41. The method of claim 33 wherein the step of forming the shaping trench includes forming the shaping trench such that the shaping trench is substantially aligned with the second trench.

42. The method of claim 33 further comprising forming first and second contacts on the first and second device portions, respectively.

43. The method of claim 42 further comprising forming first and second eutectic metal contacts on each of the first and second contacts, respectively.

44. The method of claim 42 further comprising forming third and fourth contacts on a side of the substrate opposite the device side such that the third and fourth contacts are located opposite the first and second contacts, respectively.

45. The method of claim 33 further comprising forming a sacrificial layer prior to the step of forming the second trench, and removing the sacrificial layer following the step of forming the second trench.

46. The method of claim 33 wherein the step of forming the second trench includes at least one of dicing, sawing, etching, and/or laser scribing.

47. The method of claim 46 wherein the step of forming the second trench includes laser scribing the second trench into the device side of the substrate.

48. The method of claim 46 wherein the step of forming the second trench includes sawing the second trench into the device side of the substrate.

49. The method of claim 33 wherein the second trench has a depth in the substrate of at least about 2 μm.

50. The method of claim 33 wherein the second trench has a depth in the substrate of at least about 1% of the thickness of the substrate.

51. The method of claim 33 wherein the second trench has a width in the substrate of at least about 2 μm.

52. The method of claim 51 wherein the second trench has a width in the substrate of between about 2 and 25 μm.

53. The method of claim 33 wherein the substrate is formed of a material selected from the group consisting of SiC, GaAs, GaP, sapphire and combinations thereof.

54. The method of claim 53 wherein the substrate is formed of SiC.

55. The method of claim 33 wherein the at least one device layer includes a Group III nitride.

56. A method for forming semiconductor devices using a semiconductor substrate having a device side and at least one device layer on the device side of the substrate, the at least one device layer including first and second device portions, the method comprising the steps of:
  a) forming an isolation trench in the at least one device layer, the isolation trench defining a first mesa including the first device portion and a second mesa including the second device portion; and
  b) forming a second trench in the device side of the substrate in and along the isolation trench, the second trench extending between the first and second device portions;
  c) wherein the step of forming the second trench includes laser scribing the second trench into the device side of the substrate.

57. The method of claim 56 further including breaking the substrate along the second trench to form first and second dies, the first die including a first portion of the substrate and the first device portion, and the second die including a second portion of the substrate and the second device portion.

58. The method of claim 57 wherein the first and second dies include first and second light emitting diodes (LEDs), respectively.

59. The method of claim 57 wherein the first and second dies include first and second laser diodes, respectively.

60. The method of claim 56 further comprising forming an electrically insulating passivation layer on exposed surfaces of the first and second mesas and the substrate along the second trench.

61. The method of claim 60 wherein the passivation layer is formed of an oxide, a nitride, an oxynitride, a spin-on glass, and/or a polyimide.

62. The method of claim 60 wherein the passivation layer is formed using a deposition process.

63. The method of claim 56 wherein the step of forming the isolation trench includes etching the at least one device layer.

64. The method of claim 56 further comprising forming first and second contacts on the first and second device portions, respectively.

65. The method of claim 64 further comprising forming first and second eutectic metal contacts on each of the first and second contacts, respectively.

66. The method of claim 64 further comprising forming third and fourth contacts on a side of the substrate opposite the device side such that the third and fourth contacts are located opposite the first and second contacts, respectively.

67. The method of claim 56 further comprising forming a sacrificial layer prior to the step of forming the second trench, and removing the sacrificial layer following the step of forming the second trench.

68. The method of claim 56 wherein the second trench has a depth in the substrate of at least about 2 μm.

69. The method of claim 56 wherein the second trench has a depth in the substrate of at least about 1% of the thickness of the substrate.

70. The method of claim 56 wherein the second trench has a width in the substrate of at least about 2 μm.

71. The method of claim 70 wherein the second trench has a width in the substrate of between about 2 and 25 μm.

72. The method of claim 56 wherein the substrate is formed of a material selected from the group consisting of SiC, GaAs, GaP, sapphire and combinations thereof.

73. The method of claim 72 wherein the substrate is formed of SiC.

74. The method of claim 56 wherein the at least one device layer includes a Group III nitride.

75. A method for forming semiconductor devices using a semiconductor substrate having a device side and at least one device layer on the device side of the substrate, the at least one device layer including first and second device portions, the method comprising the steps of:
  a) forming an isolation trench in the at least one device layer, the isolation trench defining a first mesa including the first device portion and a second mesa including the second device portion; thereafter b) forming a sacrificial layer over the first and second mesas; thereafter c) forming a second trench in the device side of the substrate in and along the isolation trench, the second trench extending between the first and second device portions; thereafter d) removing the sacrificial layer from the substrate; and thereafter e) breaking the substrate along the second trench to form first and second dies, the first die including a first portion of the substrate and the first device portion, and the second die including a second portion of the substrate and the second device portion.

76. The method of claim 75 further comprising forming an electrically insulating passivation layer on exposed surfaces of the first and second mesas and the substrate along the second trench.

* * * * *